(12) United States Patent
Carroll

(10) Patent No.: US 9,838,005 B2
(45) Date of Patent: Dec. 5, 2017

(54) SYSTEM AND METHOD FOR PROTECTION OF SPACECRAFT ELECTRONICS

(71) Applicant: Gedex Inc., Mississauga (CA)

(72) Inventor: Kieran A. Carroll, Brampton (CA)

(73) Assignee: GEDEX SYSTEMS INC., Mississauga (CA)

( * ) Notice: Subject to any disclaimer, the term of this patent is extended or adjusted under 35 U.S.C. 154(b) by 389 days.

(21) Appl. No.: 14/606,167

(22) Filed: Jan. 27, 2015

(65) Prior Publication Data

US 2015/0244362 A1    Aug. 27, 2015

Related U.S. Application Data

(60) Provisional application No. 61/932,491, filed on Jan. 28, 2014.

(51) Int. Cl.
| | |
|---|---|
| H01H 35/14 | (2006.01) |
| H01H 37/00 | (2006.01) |
| H01H 47/24 | (2006.01) |
| H01H 47/26 | (2006.01) |
| H03K 17/78 | (2006.01) |
| G01T 1/17 | (2006.01) |
| B64G 1/42 | (2006.01) |
| B64G 1/54 | (2006.01) |
| H02H 5/00 | (2006.01) |

(52) U.S. Cl.
CPC ............ H03K 17/78 (2013.01); B64G 1/428 (2013.01); B64G 1/546 (2013.01); G01T 1/17 (2013.01); H02H 5/005 (2013.01); *Y10T 307/773* (2015.04)

(58) Field of Classification Search
CPC ........ H03K 17/78; B64G 1/428; B64G 1/546; G01T 1/17; H02H 5/005; Y10T 307/773

USPC ......................................................... 307/117
See application file for complete search history.

(56) References Cited

U.S. PATENT DOCUMENTS 5,672,918 A  *  9/1997  Kimbrough ............ H02H 5/005
                                                                  250/389
2004/0079744 A1     4/2004  Bodeau et al.

FOREIGN PATENT DOCUMENTS

WO         2010109207         9/2010

OTHER PUBLICATIONS

GOES N Series Data Book, Revision D. http://goes.gsfc.nasa.gov/text/GOES-P_Databook.pdf.
Patent Cooperation Treaty, Notification of Transmittal of the International Search Report and the Written Opinion of the International Searching Authority, or the Declaration, dated May 21, 2015.

* cited by examiner

*Primary Examiner* — Carlos Amaya
(74) *Attorney, Agent, or Firm* — Bereskin & Parr LLP/S.E.N.C.R.L., s.r.l.

(57) ABSTRACT

A system and method for protecting an electronics module on a spacecraft in space are described. The system includes a non-radiation hardened electronics module electrically connected to a power supply, with a switch connected between the power supply and the electronics module. The switch can disconnect the electronics module from the power supply in response to an event signal. A sensor which is capable of detecting a solar proton event is connected to the switch. The sensor emits the event signal upon detection of the solar proton event.

20 Claims, 2 Drawing Sheets

SYSTEM AND METHOD FOR PROTECTION OF SPACECRAFT ELECTRONICS

CROSS-REFERENCE TO RELATED APPLICATIONS

This application claims the benefit of U.S. Provisional Patent Application No. 61/932,491 filed on Jan. 28, 2014 entitled "SOLAR PROTON EVENT DETECTOR FOR PROTECTION OF SPACECRAFT ELECTRONICS", which is incorporated by reference herein in its entirety.

FIELD

The described embodiments relate to spacecraft electronics, and more specifically to protection of commercial off-the-shelf electronics from radiation damage in space.

BACKGROUND

It has long been known that the high radiation environment of outer space, especially space beyond Low Earth Orbit (LEO), is a harsh environment that can quickly degrade the performance of Commercial Off-The-Shelf (COTS) electronics. As used herein, "Deep Space" means the region of space above Earth's radiation belts, i.e., roughly above 36,000 km in altitude above the Earth's surface. COTS electronics refers to electronics that are not specially "radiation-hardened" by design. The space environment in Deep Space is known to provide a background dose rate of radiation which is reasonably low, comparable to that in LEO. Such background dose rate of radiation is generally tolerable by COTS electronics for periods of at least several years. However, the radiation environment in Deep Space is punctuated by short periods of very high dose rates during Solar Proton Events (SPEs). A SPE can include such solar events as solar flares or coronal mass ejections (when their path intersects the spacecraft), or any other event where the number of high energy protons impacting the spacecraft suddenly and dramatically increases for a short period of time.

High dose rates of high-energy protons can be very damaging to electronics, particularly to COTS electronics, both causing rapid "aging" of some types of electronics due to Total Ionizing Dose effects, and causing Single Event Effects such as memory bit-flips, and latchups and burn-throughs of transistors. Almost all of the severe damage expected to happen to COTS electronics caused by radiation in the space environment in Deep Space is expected to happen during the few, brief, SPEs that a spacecraft would encounter during its mission. Accordingly, if the spacecraft electronics can be protected during SPEs, the likelihood that the spacecraft electronics will be safe for the duration of a multi-year mission increases.

Traditionally, this problem has been overcome by using at least one of: radiation shielding, redundant systems and specially designed and manufactured, radiation hardened electronics. Each of these has significant drawbacks. Radiation shielding is heavy and can greatly increase the cost of launching a spacecraft as well as increase the propellant required to manoeuver once in space. Redundant systems increase cost and weight as well as design complexity. The extensive testing and low production numbers of components for radiation hardened electronics leads to much higher costs on a per-part basis, and much longer development cycles due to the generally extremely long delivery lead-times for this class of part. Generally, radiation hardened electronics are also several years behind the current generation of COTS electronics, leading to larger and heavier form factors, greater power consumption and generally less capable devices.

Any spacecraft would benefit from the ability to use COTS electronics rather than specially designed and built radiation hardened electronics, but the benefit is especially significant for micro- or nano-spacecraft, where components must be small, bulky shielding is not feasible and low cost is a requirement. The ability to use COTS electronics on board a spacecraft has been shown, in many microsatellite, nanosatellite and Cubesat missions flown in LEO, to provide several benefits as compared to those using higher-grade parts. Such benefits include lower costs (since mass produced components can be used), shorter development cycles (since acquisition and testing of commercially produced electronics can be done quickly), and smaller as well as lighter form factors (since current generation electronics are smaller, often have more functions integrated onto a single chip and use, power more efficiently).

SUMMARY

The embodiments described herein provide in one aspect an electronics protection system for a spacecraft. The system can include a non-radiation-hardened electronics module and a power supply electrically connected to the electronics module. The system can also include a switch electrically connected between the electronics module and the power supply. The switch can be configured to disconnect the electronics module from the power supply in response to an event signal. The system can also include a sensor connected to the switch. The sensor can be configured for detecting a solar proton event and may emit the event signal upon detection of the solar proton event.

In some embodiments, the sensor can include at least one of an X-Ray flux detector and a high energy proton detector.

In some embodiments the sensor can be configured to detect the end of the solar proton event and to emit an event end signal upon detect of the end of the solar proton event. The switch can be configured to re-connect the electronics module to the power supply in response to the event end signal.

In some embodiments, the sensor may be de-activated upon detection of the solar proton event and periodically re-activated to detect the end of the solar proton event. In some embodiments, the sensor can remain active during the solar proton event.

In some embodiments, the switch includes at least one of a radiation shielded switch, a radiation hardened switch and a mechanical relay.

In some embodiments, the system also includes a processor connected to the sensor and the switch. The processor can be configured to receive the event signal from the sensor and transmit the event signal to the switch.

In some embodiments, the processor can be configured to transmit a power down signal to the electronics module in response to receiving the event signal, where the processor can be configured to transmit the power down signal prior to transmitting the event signal to the switch. The electronics module can be configured to de-activate in response to the power down signal.

In some embodiments, after transmitting the event signal to the switch, the processor can be configured to transmit an event end signal to the switch after a predetermined time delay. The switch can be configured to re-connect the electronics module to the power supply in response to the event end signal.

In some embodiments, the system can include a secondary electronics module electrically connected to the power supply that is configured to remain active during the solar proton event.

The embodiments described herein provide in another broad aspect a method for protecting a non-radiation-hardened electronics module on a spacecraft in space. The method can include monitoring for a solar proton event and transmitting an event signal to a switch upon detection of the solar proton event, the switch being connected to the electronics module and a power supply. The switch can disconnect the electronics module from the power supply in response to the event signal.

In some embodiments, the method can also include monitoring for a solar proton event end condition, and upon detection of the solar proton event, transmitting an event signal to the switch. The switch can re-connect the electronics module to the power supply in response to the event end signal.

In some embodiments, the end condition can be a predetermined time delay. In some embodiments, the end condition can be an end of the solar proton event.

In some embodiments, after detection of the solar proton event the method may include periodically activating a sensor for detecting the end of the solar proton event.

In some embodiments, the method can also include transmitting a power down signal, to the electronics module upon detection of the solar proton event. The electronics module can de-activate in response to the power down signal. Transmission of the event signal to the switch can also be delayed for a predetermined time period after transmitting the power down signal.

In some embodiments, the solar proton event can be detected by detecting a threshold number of protons having a proton energy above a threshold energy level. In some embodiments, the threshold energy level is about 10 MeV.

In some embodiments, the solar proton event can be detected by detecting an increase in X-Ray flux above a flux threshold.

BRIEF DESCRIPTION OF THE DRAWINGS

For a better understanding of the described example embodiments and to show more clearly how they may be carried into effect, reference will now be made, by way of example, to the accompanying drawings in which.

DETAILED DESCRIPTION OF VARIOUS EMBODIMENTS

The most destructive radiation effects sustained during a SPE by many types of COTS electronics, such as single-event upsets, single-event latchups, burn-throughs and gate ruptures may be prevented or reduced by powering down the COTS components before or shortly after the onset of the SPE, and keeping them off until the SPE has passed.

Figure 1:
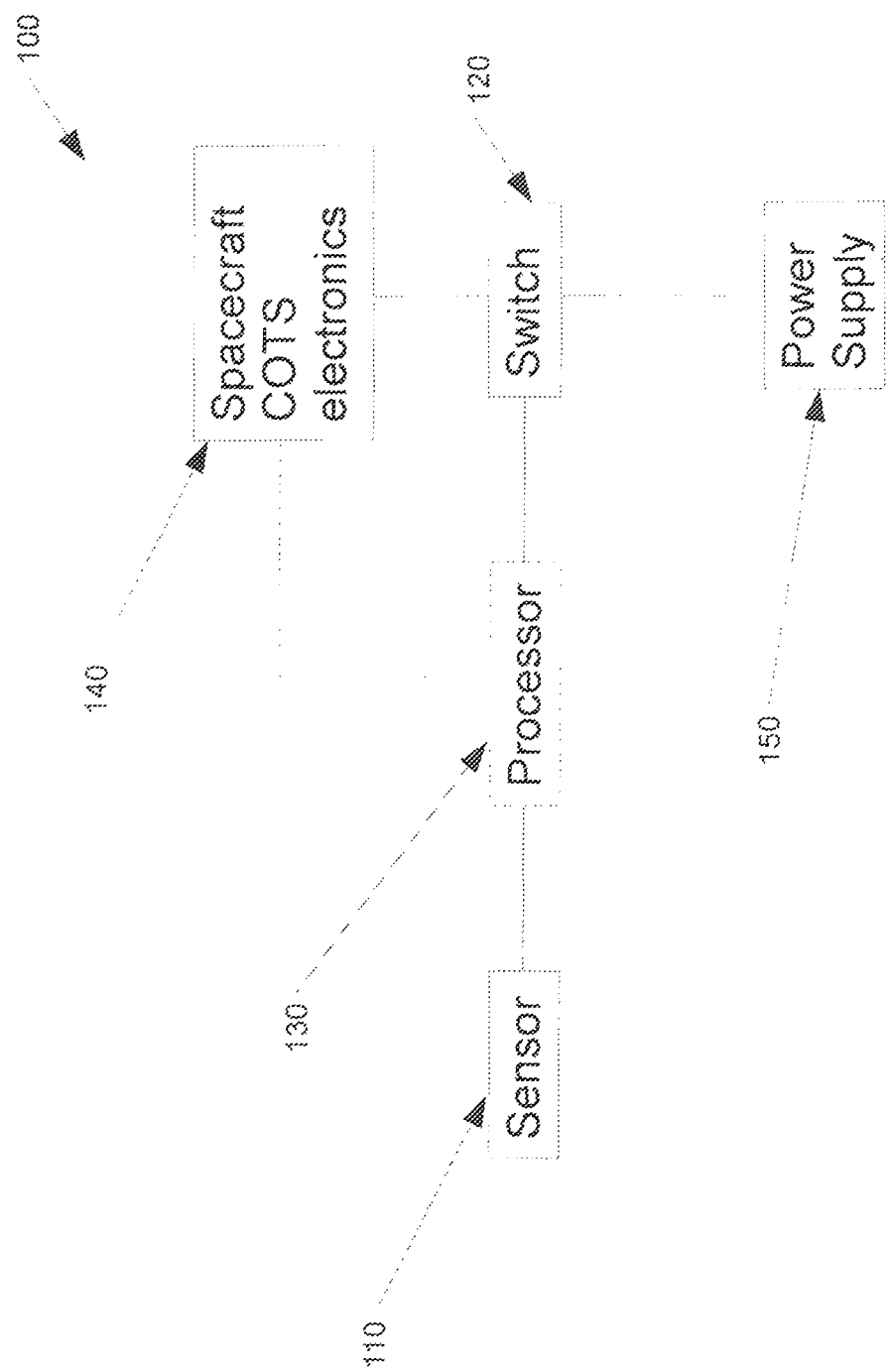
FIG. 1 shows an exemplary embodiment of a solar proton event detector for protecting spacecraft electronics.

According to one exemplary embodiment of a solar proton event detector 100, as shown in FIG. 1, a sensor 110 is preferably connected to a switch 120 via optional processor 130. Switch 120 is connected between the spacecraft COTS electronics 140 and power supply 150. If sensor 110 detects a solar proton event, switch 120 is opened, thus disconnecting the spacecraft COTS electronics 140 from power supply 150, powering down spacecraft COTS electronics 140 and protecting it from the effects of the solar proton event. Once an end condition (discussed in more detail below) is reached, switch 120 is closed, thereby reconnecting spacecraft COTS electronics 140 to power supply 150.

Sensor 110 can detect a SPE in any suitable manner. For example, sensor 110 may include a proton detector that directly detects high energy protons, for example, protons with energies above 10 MeV. Alternatively, sensor 110 may include an X-ray detector, since SPEs are often preceded by a detectable increase in X-ray flux. Sensor 110 may remain active during the power down of the spacecraft COTS electronics 140 in order to detect the end condition of the SPE. Alternatively, sensor 110 may also power down in the event the end condition is a time delay (discussed below). Sensor 110 may also include a combination of such detectors.

Switch 120 may be any type of electrical or electronic switch suitable for connecting the spacecraft COTS electronics 140 to power supply 150 and remaining functional during a SPE. Preferably, switch 120 is reliable in space applications and sufficiently robust to handle the load that will be placed upon it, even during a SPE. For example, switch 120 may include a shielded semiconductor switch a radiation hardened field effect transistor or a mechanical relay.

Processor 130 preferably allows complex conditions to be used to open and close switch 120 and may be any type of mechanism or circuit capable of receiving a signal from sensor 110, issuing instructions to switch 120 and detecting whether an end condition has been reached. An end condition can include a signal from sensor 110 indicating that the SPE has passed. Alternatively, an end condition may be a predetermined time delay. For example, the predetermined time delay may be based on the average length of a solar proton event expected to be encountered by the spacecraft. In one embodiment, processor 130 includes radiation hardened electronics and/or shielded electronics.

In an alternative embodiment, a predetermined time delay can be built in to switch 120 or processor 130 either as a primary means of opening switch 120 or as a backup in the event that processor 130 fails.

Spacecraft COTS electronics 140 may include any and all COTS electronics on board the spacecraft that may benefit from protection from the effects of a SPE. Preferably, spacecraft COTS electronics 140 is selected from components that are able to power down quickly when required. In an alternative embodiment, processor 130 is also connected to spacecraft COTS electronics 140 and signals the need to power down quickly before switch 120 is opened.

Figure 2:
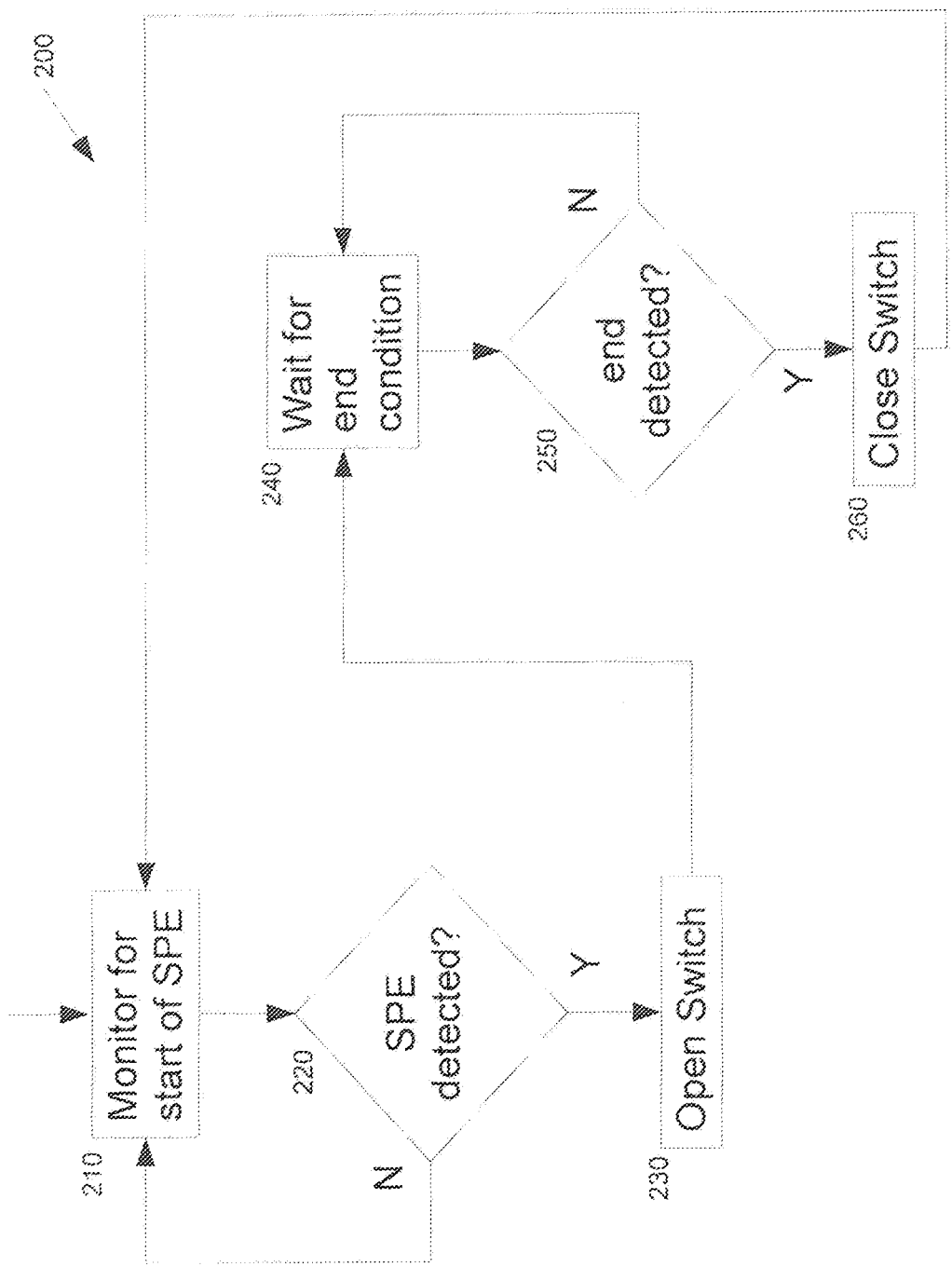
FIG. 2 shows a flow chart of the operation of the exemplary embodiment of FIG. 1.

FIG. 2 shows a flow chart 200 of the operation of the embodiment of a solar proton event detector 100 for protection of spacecraft electronics, including the optional processor 130. At 210, sensor 110 monitors for the start of a SPE. If a SPE is detected at 220, processor 130 causes switch 120 to open, at 230. Once switch 120 is open, the event detector 100 waits for an end condition 240. Once an end condition is detected at 250, switch 120 is closed, at 260, and sensor 110 begins monitoring for the start of another SPE at 210.

Many variations on the embodiments described are possible. For example, the conditions for closing switch 120 and powering up the spacecraft COTS electronics 140 can be very simple, such as a timer, or much more complex. For example, sensor 110 could remain active during the SPE or could be periodically powered up to check to see if the SPE is finished.

In an alternative embodiment, electronics that are not susceptible to damage by solar proton events can be left on. Examples of such electronics may be electronics that do not make use of semiconductors (e.g., passive components such as resistors, capacitors, coils) and any circuitry employing radiation-hard semiconductors. According to this embodiment, the spacecraft can be designed with its circuitry partitioned into at least two groups: those that will stay on during a solar proton event, and those that will be turned off during such an event. The circuits that will stay on during such an event may include the circuitry associated with turning the powered-off circuits back on.

The overall design of a spacecraft using a solar proton event detector for protection of spacecraft electronics may be subject to some general design considerations as well. Preferably, overall spacecraft systems are designed such that all circuitry using electronics that might be damaged by solar proton events (COTS electronics or other semiconductors) can be safely turned off for extended periods of time. This may include making sure that the overall system design is such that damage to the spacecraft will not occur as a result of powering down. For example, if the spacecraft's attitude will begin to tumble when its COTS electronics are powered down, it could be designed with solar panels facing in multiple directions so that it won't lose power while powered down and tumbling. Similarly, the spacecraft thermal design should be such that it won't get too hot or too cold while powered down and tumbling. This could involve carefully selecting thermal control coatings on various surfaces to achieve that effect, and/or having heaters (with controllers that stay active while the COTS electronics are powered down) to keep internal temperatures from dropping too far. Further, consideration should also be given to designing the spacecraft systems so that all of the COTS circuitry can be turned off by a simple, centralized command, for example by actuating a relay (switch 120), and that it can be similarly turned back on again by a simple, centralized action.

Preferably, overall mission design should also be considered carefully for a spacecraft equipped with a solar proton event detector. Specifically, the mission should be designed in such a way that the spacecraft will have an adequately high probability of surviving a SPE induced shut-down. This could include, for example, designing trajectories when in the vicinity of a planetary body, such that failing to carry out a propulsive event will not result in mission failure, e.g., will not result in collision with a planet, or will not result in irretrievably missing an opportunity to carry out a necessary orbital change. The latter could include designing a trajectory such that it includes multiple opportunities to fire a rocket to leave Earth orbit going in the correct direction. Such design is advantageous in case a solar proton event forces the spacecraft to power down during the first such opportunity, in which case it can take a subsequent opportunity to leave Earth orbit. In another embodiment, the spacecraft can include a means for temporarily disabling the circuitry that turns off the non-radiation-hard electronics, so that in the case of time-critical mission events, the spacecraft will be unable to power down during the period when such an event needs to happen. This could, for example, be commanded from a ground controller, or could be pre-programmed. Disabling the power down circuitry would involve taking the risk that the non-radiation-hard electronics would be damaged during a solar proton event. However, taking that risk might be acceptable near the time of a mission-critical event.

A number of embodiments have been described herein. However, it will be understood by persons skilled in the art that other variants and modifications may be made without departing from the scope of the embodiments as defined in the claims appended hereto.

The invention claimed is:

1. An electronics protection system for a spacecraft, the system comprising:
 a) a non-radiation-hardened electronics module;
 b) a power supply electrically connected to the electronics module;
 c) a switch electrically connected between the electronics module and the power supply, wherein the switch is configured to disconnect the electronics module from the power supply in response to an event signal; and
 d) a sensor connected to the switch, wherein the sensor is configured for directly detecting a solar proton event independent of monitoring the electronics module or power supply, wherein the sensor is configured for emitting the event signal upon detection of the solar proton event.

2. The system of claim 1, wherein the sensor comprises at least one of an X-Ray flux detector and a high energy proton detector.

3. The system of claim 1, wherein:
 a) the sensor is further configured to detect an end of the solar proton event, wherein the sensor is configured for emitting an event end signal upon detection of the end of the solar proton event; and
 b) the switch is configured to re-connect the electronics module to the power supply in response to the event end signal.

4. The system of claim 3, wherein:
 a) the sensor is de-activated upon detection of the solar proton event, and wherein the sensor is periodically re-activated to detect the end of the solar proton event.

5. The system of claim 3, wherein:
 a) the sensor remains active during the solar proton event.

6. The system of claim 1, wherein:
 a) the switch comprises at least one of a radiation shielded switch, a radiation hardened switch and a mechanical relay.

7. The system of claim 1, further comprising:
 a) a processor connected to the sensor and the switch, wherein the processor is configured to receive the event signal from the sensor and transmit the event signal to the switch.

8. The system of claim 7, wherein:
 a) the processor is configured to transmit a power down signal to the electronics module in response to receiving the event signal, wherein the processor is configured to transmit the power down signal prior to transmitting the event signal to the switch; and
 b) the electronics module is configured to de-activate in response to the power down signal.

9. The system of claim 7, wherein:
 a) after transmitting the event signal to the switch, the processor is configured to transmit an event end signal to the switch after a predetermined time delay; and
 b) the switch is configured to re-connect the electronics module to the power supply in response to the event end signal.

10. The system of claim 1, further comprising:
a) a secondary electronics module electrically connected to the power supply, the secondary electronics module configured to remain active during the solar proton event.

11. A method for protecting a non-radiation-hardened electronics module on a spacecraft in space, the method comprising:
a) directly monitoring for a solar proton event independent of monitoring the electronics module or power supply;
b) upon detection of the solar proton event, transmitting an event signal to a switch, the switch being connected to the electronics module and to a power supply; and
c) the switch disconnecting the electronics module from the power supply in response to the event signal.

12. The method of claim 11, further comprising:
a) monitoring for a solar proton event end condition;
b) upon detection of the solar proton event end condition, transmitting an event end signal to the switch; and
c) the switch re-connecting the electronics module to the power supply in response to the event end signal.

13. The method of claim 12, wherein:
a) the end condition is a predetermined time delay.

14. The method of claim 12, wherein:
a) the end condition is an end of the solar proton event.

15. The method of claim 14, further comprising:
a) after detection of the solar proton event, periodically activating a sensor for detecting the end of the solar proton event.

16. The method of claim 12, further comprising:
a) transmitting a power down signal to the electronics module upon detection of the solar proton event;
b) the electronic module de-activating in response to the power down signal; and
c) delaying transmission of the event signal to the switch for a predetermined time period after transmitting the power down signal.

17. The method of claim 11, wherein:
a) the solar proton event is detected by detecting protons having a proton energy above a threshold energy level.

18. The method of claim 17, wherein the threshold energy level is about 10 MeV.

19. The method of claim 11, wherein:
a) the solar proton event is detected by detecting an increase in X-Ray flux.

20. An electronics protection system for a spacecraft, the system comprising:
a) a non-radiation-hardened electronics module;
b) a power supply electrically connected to the electronics module;
c) a switch electrically connected between the electronics module and the power supply, wherein the switch is configured to disconnect the electronics module from the power supply in response to an event signal; and
d) a sensor connected to the switch, wherein the sensor is configured for detecting a solar proton event and for emitting the event signal upon detection of the solar proton event, and the sensor is further configured to detect an end of the solar proton event and for emitting an event end signal upon detection of the end of the solar proton event;
wherein the switch is further configured to re-connect the electronics module to the power supply in response to the event end signal.

* * * * *